(12) United States Patent
Stoltz et al.

(10) Patent No.: US 7,273,565 B2
(45) Date of Patent: *Sep. 25, 2007

(54) METHOD FOR MANUFACTURING A PHOTONIC DEVICE AND A PHOTONIC DEVICE

(75) Inventors: Björn Stoltz, Stockholm (SE); Eskil Bendz, Stockholm (SE)

(73) Assignee: Finisar Corporation, Sunnyvale, CA (US)

( * ) Notice: Subject to any disclaimer, the term of this patent is extended or adjusted under 35 U.S.C. 154(b) by 117 days.

This patent is subject to a terminal disclaimer.

(21) Appl. No.: 10/506,563

(22) PCT Filed: Mar. 7, 2003

(86) PCT No.: PCT/SE03/00387

§ 371 (c)(1), (2), (4) Date: Apr. 29, 2005

(87) PCT Pub. No.: WO03/077390

PCT Pub. Date: Sep. 18, 2003

(65) Prior Publication Data

US 2005/0213911 A1    Sep. 29, 2005

(30) Foreign Application Priority Data

Mar. 13, 2002 (SE) .................................... 0200750

(51) Int. Cl.
*B29D 11/00*    (2006.01)
*H01L 21/00*    (2006.01)

(52) U.S. Cl. ............................ 216/24; 216/41; 216/58; 438/694; 385/129

(58) Field of Classification Search .................. 216/24, 216/41, 58; 438/694; 385/129
See application file for complete search history.

(56) References Cited

U.S. PATENT DOCUMENTS 5,250,462 A * 10/1993 Sasaki et al. .................. 438/24

(Continued)

FOREIGN PATENT DOCUMENTS

DE    38 10 767 A1    10/1989

(Continued)

OTHER PUBLICATIONS

N. Bouadma et al., "1.3-μm GaInAsP/InP Buried-Ridge-Structure Laser and its Monolithic Integration with Photodetector Using Reactive Ion Beam Etching", Journal of Lightwave Technology, vol. 12, May 15, 1999, pp. 742-748.

(Continued)

*Primary Examiner*—Shamim Ahmed
(74) *Attorney, Agent, or Firm*—Workman Nydegger

(57) ABSTRACT

The present invention relates to a photonic device having a first set of layers (22) including at least a first waveguide layer (3) arranged in a waveguide mesa (61). A cladding layer (7) is arranged on top of the waveguide mesa (61) and surrounding semiconductor material (1). A contact layer (8) is arranged on top of the cladding layer (7), and a metal contact (9, 80) is arranged on top of the contact layer (8). The cladding (7) and contact (8) layer are shaped in an etching process to have a mesa structure at least above the waveguide mesa (61). An insulating material (25, 82) is also applied around the mesa structure. Optionally a second photonic device having a second set or layers (31) including at least a second waveguide layer (33), may be coupled to the first photonic device in a light transmission direction thereof. The invention also relates to a method for manufacturing, the photonic device.

28 Claims, 7 Drawing Sheets

U.S. PATENT DOCUMENTS

| | | | |
|---|---|---|---|
| 5,538,918 A | | 7/1996 | Haase et al. |
| 6,226,310 B1 | * | 5/2001 | Takagi et al. ............ 372/50.11 |
| 2002/0064201 A1 | * | 5/2002 | Matsumoto ................. 372/50 |
| 2005/0202679 A1 | * | 9/2005 | Stoltz et al. ................ 438/694 |

FOREIGN PATENT DOCUMENTS

| | | |
|---|---|---|
| WO | WO99/39413 | 8/1999 |
| WO | WO 01/13479 A1 | 2/2001 |

OTHER PUBLICATIONS

P. Olala et al., "DFB Laser Monolithically Integrated With an Absorption Modulator With Low Residual Reflectance and Small Chirp", Electronics Letters, May 13, 1993, vol. 29 No. 10, pp. 859-860.

* cited by examiner

METHOD FOR MANUFACTURING A PHOTONIC DEVICE AND A PHOTONIC DEVICE

TECHNICAL FIELD

The present invention relates to a method for manufacturing a photonic device, more specifically an active photonic device such as a laser, as defined by the preamble of claim 1. The invention also relates to a photonic device as defined by the preamble of claim 17.

BACKGROUND TO THE INVENTION

Fibre optical communications uses light confined in an optical fibre for transferring information over long distances. For high speed transmission over long distances, an important light source for fibre optical communication is the Distributed Feed-Back laser (DFB-laser).

Two major types of DFB-lasers exists: Buried Heterostructure (BH) and Ridge. These two types are briefly described in connection with FIG. 1a and 1b. Both have their advantages, e.g. the BH in general gives better performance and the Ridge is simpler to manufacture.

Even better performance may be obtained by adding a modulator to the DFB laser, e.g. an integrated Electro Absorption modulator (DFB-EA), since it introduces less chirp than direct modulation of the laser.

The DFB-EA component is made of a laser (DFB) and a modulator (EA). The device may be manufactured in many different ways and a popular way is to first epitaxially grow the laser material, then etch away all material not needed for the laser part and regrow new material around the laser (Butt Joint) to use for the modulator. Then a Ridge DFB-EA could be made if a contact layer is grown on top of the laser and the modulator material followed by etching the ridge. When manufacturing a Ridge DFB-EA laser, relatively high threshold currents, poor thermal properties and high contact resistance are major issues.

These issues may be taken care of by manufacturing a BH DFB laser instead, this however requires one or two extra epitaxial process steps and hence increases the complexity (and price) of the device.

In DE 3810767 A1, a photonic device is described comprising a Ridge DFB laser having a BH structure. A cladding layer is added on top of the ridge structure and a contact layer is arranged on top of that. The width of the contact layer is limited and an insulating material, such as SiO2, is arranged beside the contact layer on both sides. A metal contact is thereafter provided on top of the contact layer and the insulating material.

In an article by N. Bouadma and J. Semo with the title "1.3-μm GaInAsP/InP Buried-Ridge-Structure Laser and its Monolithic Integration with Photodetector Using Reactive Ion Beam Etching" a photonic device is shown (see FIG. 4) where isolation of the component is achieved by implantation of protons into adjacent regions. This is a difficult technique to use when the mesa structure is high.

Insulating materials, such as BCB (Benzocyclobutene), has been used in micro chip fabrication for a long time, e.g. see article by R. A. Kirchhoff, C. J. Carriere, K. J. Bruza, N. G. Rondan, and R. L. Sammler with the title "Benzocyclobutenes: A new class of high performance polymers" Science-Chemistry, Vol A28, Nos. 11 & 12, 1991, pp. 1079-1113. The material has been used in a variety of electronics applications ranging from conductive, metal-filled adhesives to high planarizing and insulating layers on silicon wafers.

SUMMARY OF THE INVENTION

The object of the invention is to provide a method for manufacturing a photonic device which combines the easy manufacturing of a Ridge device with the good performance of a Buried Heterostructure device.

This object is achieved by the characterizing features of claim 1, and the characterizing features of claim 17.

An advantage with the present invention is that it is simpler to manufacture compared to an ordinary BH device, having the same or better performance, with a potential for high yield and low cost.

Another advantage is that a higher reliability due to the simpler manufacturing process.

The invention is further described below in connection with the appended drawings, which are included as examples illustrating the invention.

BRIEF DESCRIPTION OF THE DRAWINGS

FIG. 5 shows a top view of a mesa cut mask applied on top of the semiconductor wafer shown in FIG. 4a.

FIGS. 6b and 6c show cross-sectional views along lines A-A and B-B, respectively, in FIG. 6a.

FIG. 7a shows a top view of the metal mask arranged on top of the mesa in FIG. 6a.

FIGS. 7b and 7c show cross-sectional views along lines A-A and B-B, respectively, in FIG. 7a.

FIGS. 8b and 8c show cross-sectional views along lines A-A and B-B, respectively, in FIG. 8a.

DETAILED DESCRIPTION OF PREFERRED EMBODIMENTS

Figure 1A:
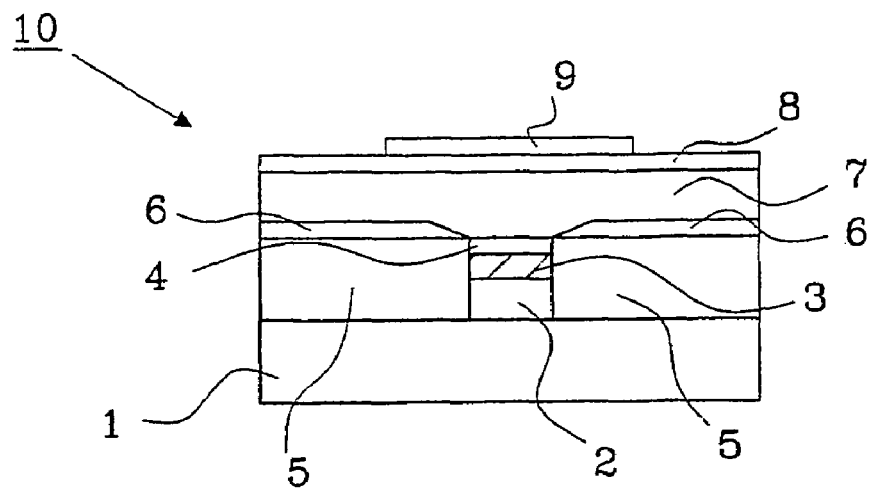
FIG. 1a shows a prior art Buried Heterostructure (BH) laser.
Figure 1B:
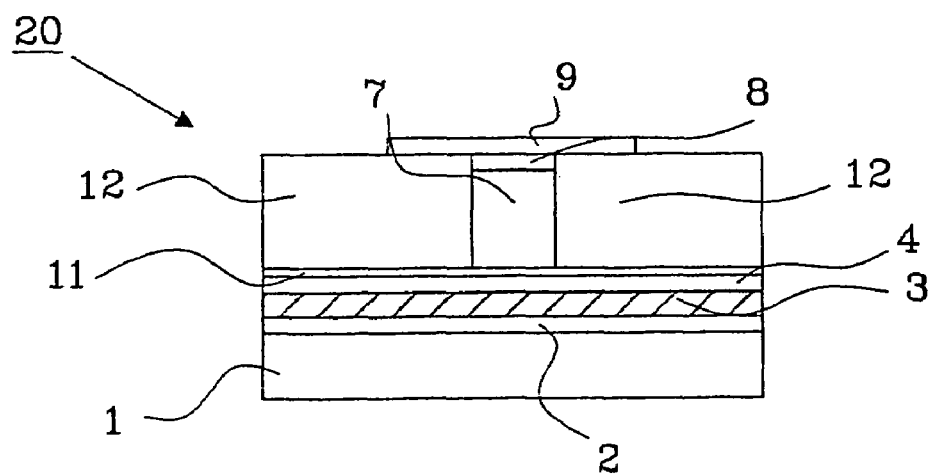
FIG. 1b shows a prior art ridge laser.

FIGS. 1a and 1b have briefly been discussed in the background to the invention, where FIG. 1a shows a BH DFB laser and FIG. 1b shows a ridge DFB laser. These will now be described in more detail. In the case where the same reference numeral is used in different figures, it will indicate the same or similar feature.

The buried heterostructure DFB laser 10 shown in FIG. 1a is manufactured on top of a semiconductor substrate 1. A set of layers including an epitaxial layer 2, a waveguide layer 3 and a protective layer 4 are thereafter grown on top of the substrate 1. The protective layer 4 may also include a grating with a protective coating arranged on top of the grating. The set of layers 2-4 is thereafter shaped into a waveguide mesa having a predetermined width. The substrate is preferably InP and has a first type of dopant, e.g. n-type (n-InP). In this example, the epitaxial layer 2 is also n-InP, the waveguide layer is InGaAsP and the protective layer is p-InP.

A semi-insulating InP (SI-InP) layer 5 is arranged beside the waveguide mesa and a n-InP layer 6 is applied on top of the semi-insulating InP layer 5. A p-InP cladding layer 7 is thereafter arranged on top of the n-InP layer 6 and in contact with the protective layer 4. A p-InGaAs contact layer 8 is arranged on top of the cladding layer 7 and a metal contact 9 is arranged on top of the contact layer 8.

The ridge DFB laser 20 shown in FIG. 1b is manufactured on top of a semiconductor substrate 1. A set of layers including an epitaxial layer 2, a waveguide layer 3 and a protective layer 4 are thereafter grown on top of the substrate 1. The substrate is preferably InP and has a first type of dopant, e.g. n-type (n-InP). In this example, the epitaxial layer 2 is also n-InP, the waveguide layer is InGaAsP and the protective layer is D-InP.

An InGaAsP etch stop layer 11 is thereafter arranged on top of the protective layer 4 and a cladding layer 7 is grown on top of the etch stop layer 11. A contact layer 8 is grown on top of the cladding layer 7. The contact layer 8 and the cladding layer 7 are thereafter shaped into a ridge by an etch process, to etch all the way down to the etch stop layer 11. An insulating material 12, such as a polymer, is thereafter spun on. A metal contact 9, which is in connection with the contact layer 8, is arranged on top of the laser.

Figure 2A:
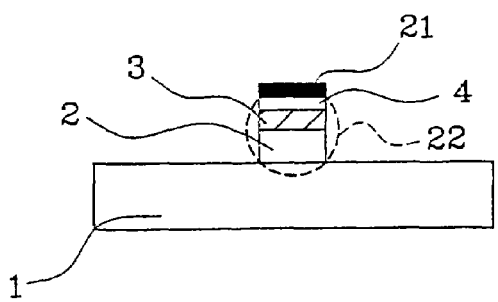
FIGS. 2a-2c show a manufacturing process of a photonic device according to a first embodiment of the invention.
Figure 2B:
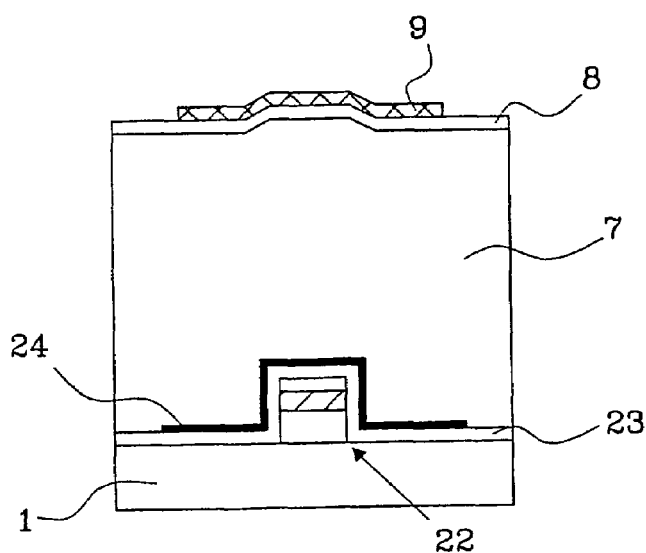
Figure 2C:
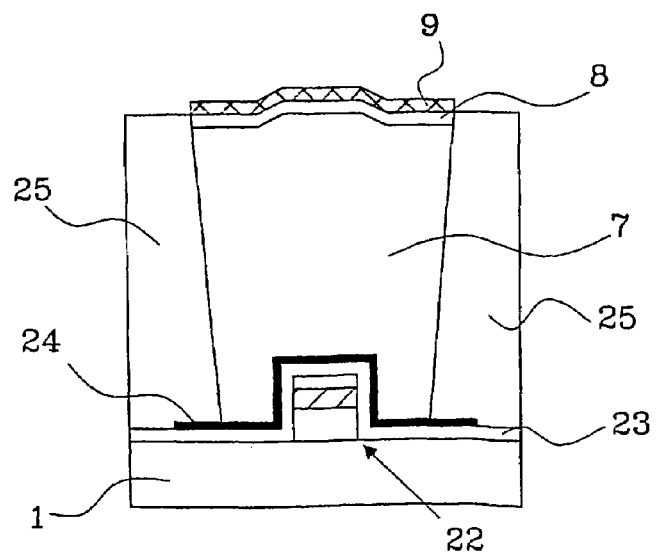

FIGS. 2a-2c show the manufacturing process of a first embodiment of a photonic device in cross-section. The inventive method is similar to the BH process (see FIG. 1a), the waveguide mesa is first typically dry etched, but instead of burying the mesa epitaxially with regrown semi-insulating (SI) material, a cladding layer and a contact layer are grown directly. A metal contact is applied on the grown contact layer and acts as a mask in the following wet etch steps where the contact mesa is formed. A polymer, which acts as an insulating and capacitance lowering material between the bond pad (not shown) to the metal contact and the substrate, is thereafter spun on and cured.

In FIG. 2a, a set of layers, comprising an epitaxial layer 2, a waveguide layer 3 and a protective layer 4 are grown on top of the substrate 1 and shaped into a waveguide mesa 22. The shaping is performed by applying a waveguide mask 21, preferably made of nitride, approximately 1.2-1.4 μm wide on top of the protective layer 4, and thereafter dry etching the unmasked layers to obtain the shape shown in FIG. 2a. The waveguide mask 21 is thereafter removed before the next process step.

A thin p-InP layer 23 is epitaxially grown around the waveguide mesa 22 and the surrounding substrate 1, the thickness of the thin layer 23 preferably being 100 nm, and an etch stop layer 24, having a thickness of preferably 10 nm InGaAsP, is thereafter epitaxially grown on top of the thin layer 23 to cover at least the thin layer on top of the waveguide mesa 22 and adjacent areas, but preferably covering all of the thin layer 23. The process steps for providing the device with the thin layer 23 and the etch stop layer 24 are optional and thus not necessary to carry out the invention, but the presence of these layers will simplify and improve the manufacturing process.

A cladding layer 7 is thereafter epitaxially grown on top of the etch stop layer 24 or directly on top of the waveguide mesa 22 and the surrounding substrate 1 if the steps for providing the thin layer 23 and the, etch stop layer 24 are omitted. A typical thickness of the cladding layer 7 is 1.8 μm. A contact layer 8 is epitaxially grown on top of the cladding layer 7, where a typical thickness of the contact layer is 0.3 μm.

In this embodiment a metal mask 9, which will be used to both form the contact mesa and to electrically contact the photonic device, is arranged above the waveguide mesa. The width of the metal mask 9 is typically about 6-8 μm.

Two different wet etch processes has been applied in FIG. 2c to firstly etch the contact layer 8 and secondly to etch the cladding layer 7. Other etch processes may be used, e.g. dry etching, to obtain the same result. The shape of the contact mesa obtained depend on the etch processes, the thickness of the cladding layer etc. The etching is terminated by the etch stop layer 24 (if present) and an insulating material is arranged around the contact mesa, comprising the cladding layer 7 and the contact layer 8. The insulating material is preferably a material which is easy to planarise, such as polymer.

An example of an insulating material is BCB (benzocyclobutene) which is available from Dow Chemical. The dielectric constant of the insulating material $\epsilon_{r,in}$ is lower than the dielectric constant of the cladding layer $\epsilon_{r,cl}$. The dielectric constant of BCB $\epsilon_{r,BCB}=2.6$ and the dielectric constant of the cladding layer $\epsilon_{r,cl}\approx 12$.

A bond pad (not shown) is normally arranged on top of the metal mask 9, which mask acts as a metal contact in this embodiment.

The following properties are typical for the described invention compared to a pure ridge laser described in connection with FIG. 1b:

lower threshold currents,
lower contact resistance with wide contact mesa,
better thermal properties with wide contact mesa,
laser with higher relaxation oscillation frequency due to smaller active volume (waveguide layer) but larger capacitances.

When operating the laser current will run through the waveguide layer since the p-n junction between the n-InP substrate 1 and the p-InP cladding layer 7 has a larger bandgap (approx. 1.35 eV) compared to the waveguide layer 3 (0.95 eV for Q1.3 and 0.8 eV for Q1.55). This way to make a "hybrid Ridge-BH laser" gives the advantages of easy process and low threshold currents (since the volume of the waveguide material is smaller).

FIGS. 3a-3b and 4a-4b illustrates how to optically connect two photonic devices to each other. This process is known as "Butt Joint".

Figure 3B:
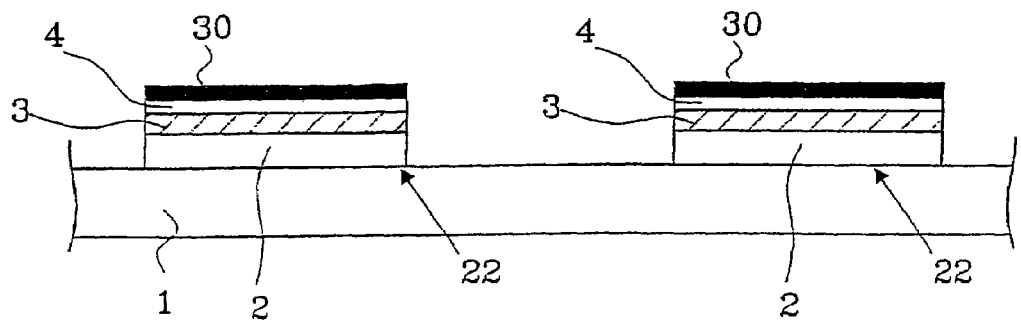
FIGS. 3a and 3b show a top view and a cross-sectional view, respectively, of a semiconductor wafer with an etched island mesa mask.
Figure 3A:
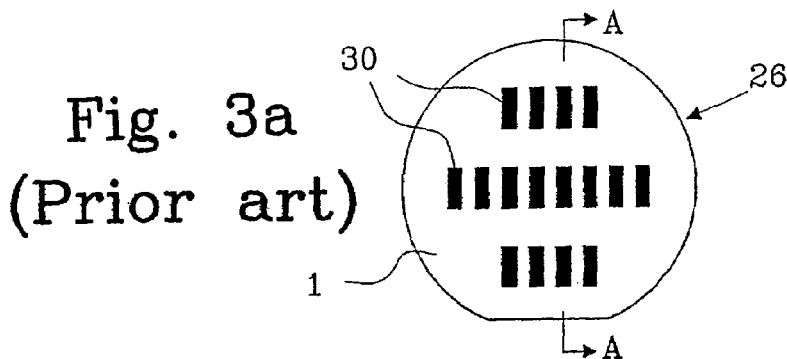

FIG. 3a shows a top view of a semiconductor wafer 26, which has been provided with a first set of layers 22 as described in connection with FIG. 2a. Instead of thereafter applying a waveguide mask and forming the laser, as described in connection with FIG. 2a, an island mask 30 is arranged on the first set of layers 22 and the unmasked areas are thereafter etched down to the substrate 1. FIG. 3b shows a cross-sectional view along line A-A in FIG. 3a. The island mask 30 is preferably a nitride mask and is typically 10×500 μm.

Figure 4B:
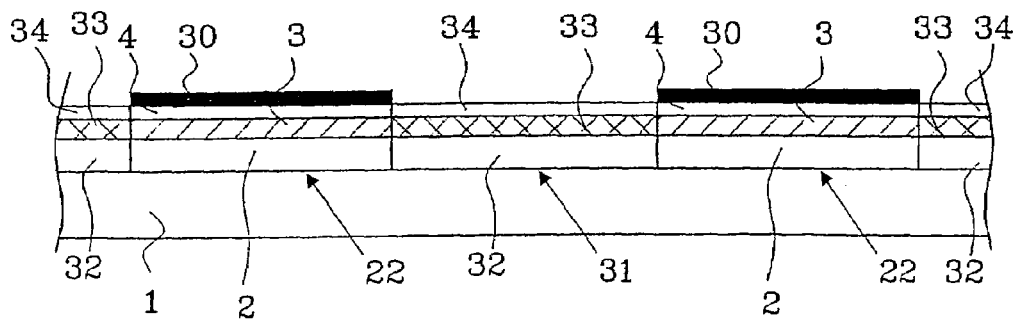
FIGS. 4a and 4b show a top view and a cross-sectional view, respectively, of a semiconductor wafer with regrown modulator material.
Figure 4A:
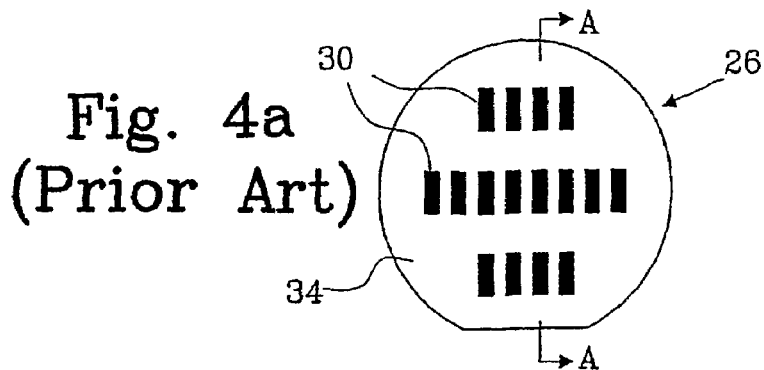

FIG. 4a shows a top view of a semiconductor wafer 26, upon which a second set of layers 31, comprising an n-InP layer 32, a second waveguide layer 33 and a protective layer 34, has been grown. The second set of layers 31 (corresponding to modulator material) surrounds the first set of layers 22 (i.e. the laser material). FIG. 4b shows a cross-sectional view along line A-A in FIG. 4a.

This process of obtaining laser material optically connected to modulator material is called "Butt Joint", as mentioned above, and is widely used in photonic device manufacture. The island mask is thereafter removed and the wafer with the islands of laser material surrounded with modulator material may be used for further processing.

Alternative methods for optically connecting the laser and modulator material that may be used to implement the present invention are SAG (Selective Area Growth), as is described in the published patent application WO 00/38284, and Quantum Well Intermixing (QWI) also known as Impurity Free Vacancy Disordering. QWI is a method where the complete wafer surface is covered by a single set of layers, including a waveguide layer. Island masks are applied to the surface, to protect the areas where the lasers are to be created, and a substance, e.g. quartz, is sputtered onto the exposed surface. The wafer is thereafter annealed, which will cause a mixing of the quantum wells and thus a change in the material into modulator material. This is well known for a skilled person in the art.

Figure 5:
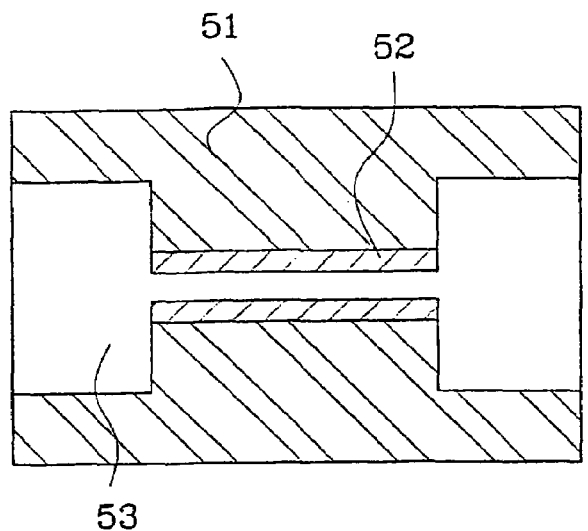

FIG. 5 is a top view of a single island of laser material 52 surrounded with modulator material 51 covered with a mesa cut mask 53, which is mainly used to shape the laser material. The width of the waveguide is 1-1.5 μm to keep the waveguide in a single mode of operation. In the modulator material the width is adjusted to give negligible influence on the fundamental mode of the laser waveguide. The material in the unmasked areas (both laser and modulator material) is thereafter etched down to the substrate 1. The result after the etching process is complete and the mesa cut mask 53 is removed is shown in FIG. 6a.

Figure 6A:
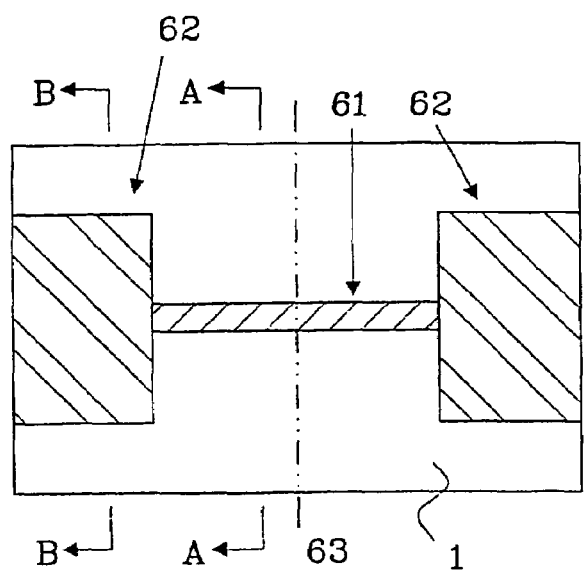
FIG. 6a shows a top view of the semiconductor wafer with the resulting mesa after the etching using the mesa cut mask in FIG. 5.
Figure 6B:
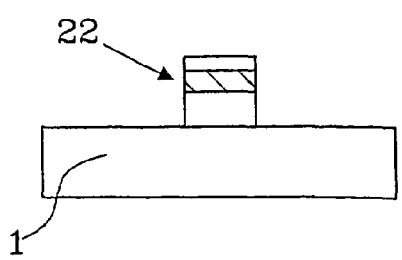
Figure 6C:
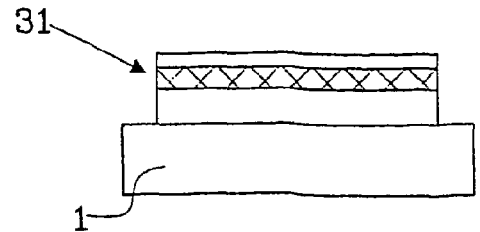

In FIG. 6a, an area 61 with laser material (i.e. the first set of layers 22) is present between two areas 62 with modulator material (i.e. the second set of layers 31). This is actually two photonic devices and when the component is completed. The laser material is cleaved along line 63 to separate the two devices from each other. Furthermore, FIG. 6b and FIG. 6c show a cross-sectional view along A-A and B-B, respectively, of FIG. 6a.

Figure 7A:
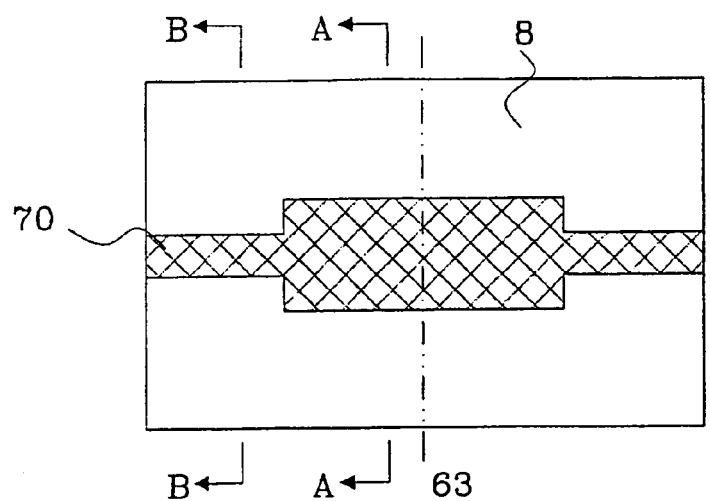

FIG. 7a shows a top view of the two photonic devices from FIG. 6a, where a cladding layer 7 has been epitaxially grown on top of the first and second set of layers and the surrounding substrate 1. Furthermore a contact layer 8 is epitaxially grown on top of the cladding layer 7. An etch stop layer may also be included, as described earlier, but is omitted in this embodiment. A mask 70 is also provided on top of the contact layer 8, said mask 70 preferably being a metal mask and more specifically made from titanium.

Figures 7B, 7C:
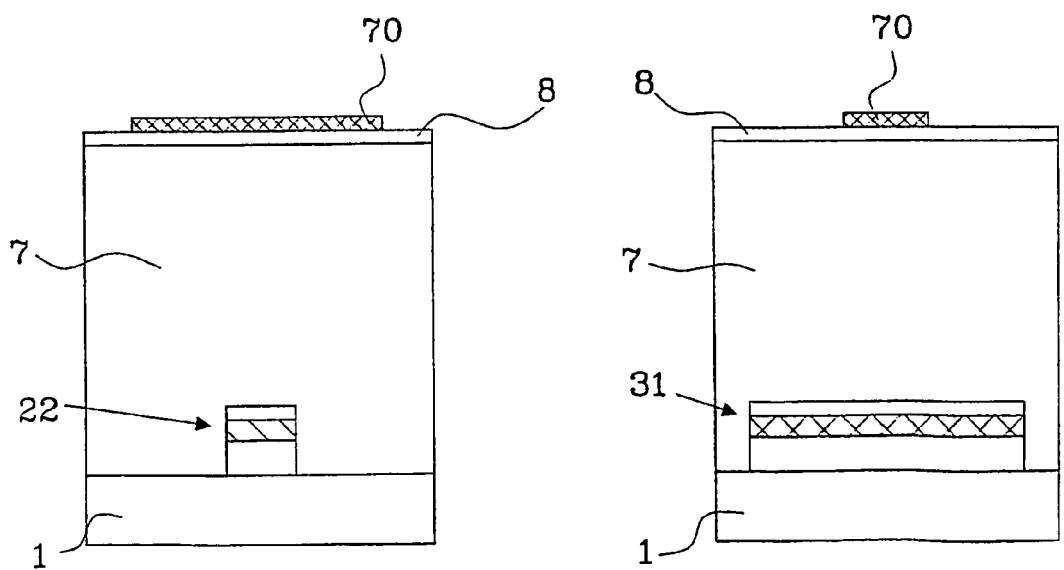

FIG. 7b shows a cross-sectional view of the first photonic device (i.e. the laser) in FIG. 7a along A-A. The mask 70 acts as a mask in the following etch step(s), preferably wet etch step(s), where the contact mesa, or ridge, is made. The ridge is wide in the laser section and is reduced to an appropriate width to support a single mode in the modulator section as indicated in FIG. 7c, which is a cross-sectional view of the second photonic device (i.e. the modulator) in FIG. 7a along B-B.

Figure 8A:
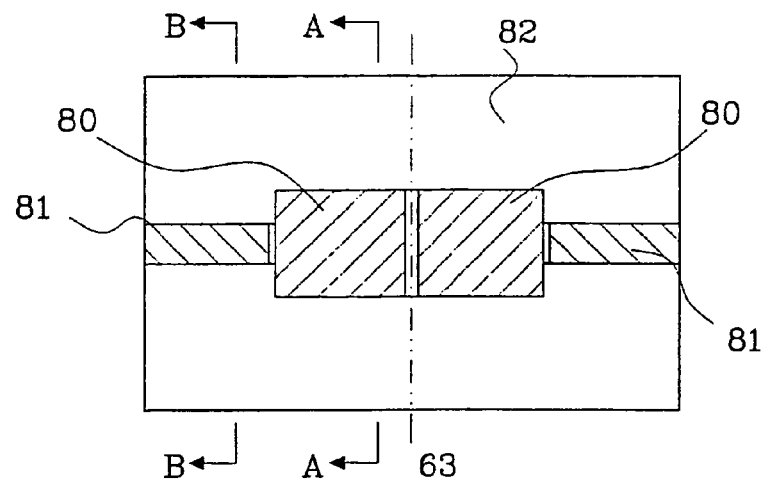
FIG. 8a shows a top view of the metal contacts arranged on top of the photonic device according to a second embodiment of the present invention.
Figure 8B:
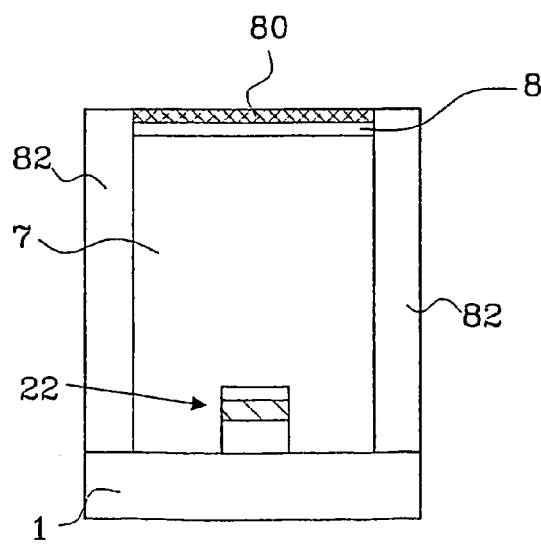
Figure 8C:
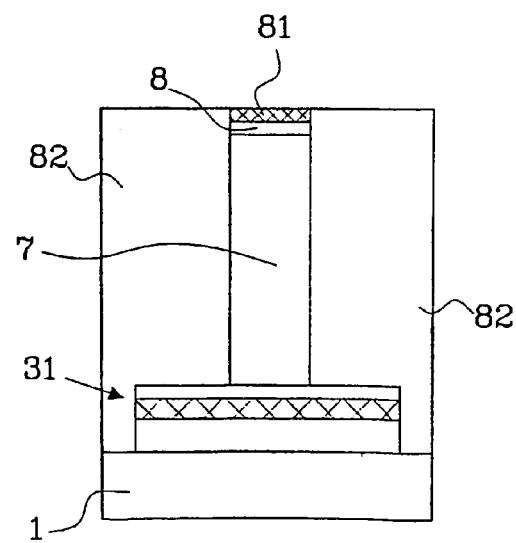

Thereafter is an insulating material 82 spun on and cured, and the mask 70 is removed to be replaced with separate metal contacts for each photonic device, i.e. a laser contact 80 and a modulator contact 81 in this example. A top view of this is shown in FIG. 8a. Cross-sectional views along A-A and B-B of FIG. 8a is shown in FIG. 8b and 8c, respectively.

It is not necessary to divide the laser contact 80 for the two photonic devices, which are separated when cleaved along line 63.

The insulating material acts as an insulating and capacitance lowering material between bond pads (not shown) to the metal contacts 80 and 81 and the substrate 1. The same advantages will be applicable for the combined laser/modulator as for the single photonic device, as described earlier. The increased capacitance in the laser section is also an advantage for the DFB-EA as compared to a pure ridge waveguide.

By combining a hybrid BH-ridge laser with a true ridge modulator good coupling between the sections is achieved. The use of butt-joint coupling allows individual optimisation of both sections. The advantage is a simple process with a potential for high yield and low cost. Also, due to the simple process, a high reliability is achieved. The structure yields a low capacitance in the modulator due to the use of a narrow ridge and an insulating material under the bond pads (not shown in the drawings), combined with a high capacitance in the laser, due to the p-n junction, leading to a stable laser source.

Figure 9:
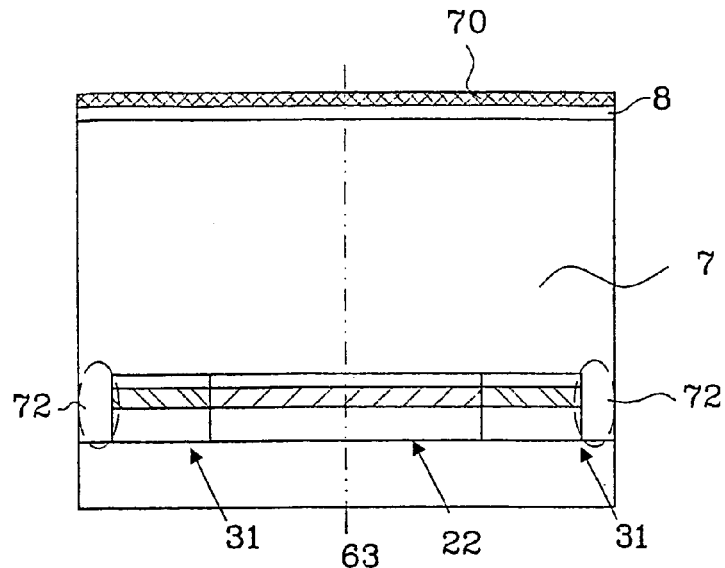
FIG. 9 shows a cross-sectional view of a manufacturing step of a third embodiment of the present invention including a window section.

The proposed process makes it easy to implement the needed "window" at the end of the modulator (or even at the end of the laser if a modulator is not used). This is briefly illustrated in FIG. 9. By removing a part of the modulator material at the output facet during the mesa cut etching step, illustrated in FIG. 5, and replacing it with p-InP during the growth of the cladding layer 7, indicated by 72 in FIG. 9, the light from the modulator is propagating without guidance and expanding. The expansion will reduce the light reflected back into the laser section from the facet. Consequently, the stringent demands on the anti-reflection coating at the facet are alleviated.

Figure 10A:
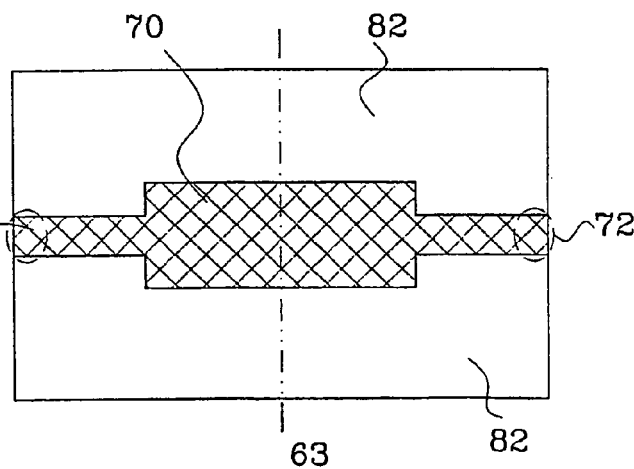
FIGS. 10a and 10b show two different metal masks that may be used to create the window section.
Figure 10B:
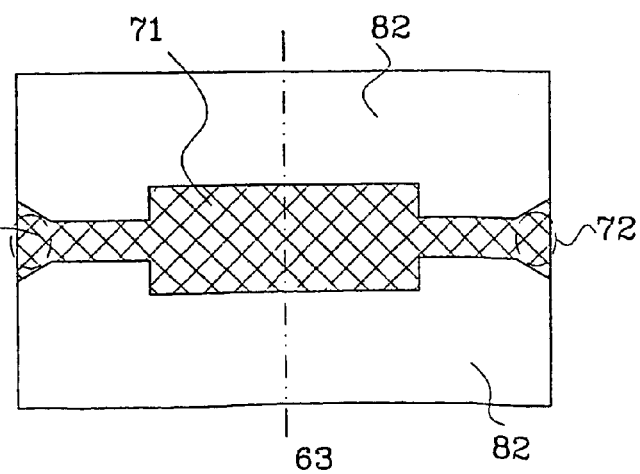

FIG. 10a and 10b show two different masks that may be used when creating the window section. The masking for the window section 72 may have the same width as for the modulator, FIG. 10a, or have an alternative shape, e.g. tapered as shown in FIG. 10b. The material in the unmasked areas in both FIG. 10a and 10b will be etched down and the insulating material 82 replacing it.

In all the different embodiments of the present invention a substrate has been used upon which the photonic devices have been manufactured, but it is of course possible to manufacture the devices on top an epitaxially grown layer on any type of substrate, such as a semi-insulating substrate.

This process may also be used when manufacturing DBR lasers with or without an optically connected modulator (DBR-EA) or a device with an integrated amplifier or detector.

The invention claimed is:

1. A method for manufacturing at least a first photonic device, comprising the steps:
    a) epitaxially growing a first set of layers, including at least a first waveguide layer, on a semiconductor material having a dopant of a first type;
    b) applying a first mask on top of the grown layers, removing the first set of layers in the unmasked areas, to form at least said first set of layers in a first waveguide mesa, and removing the first mask;
    c) epitaxially growing a cladding layer at least around said first waveguide mesa, said cladding layer having a dopant of a second type, opposite to said first type;
    d) epitaxially growing a contact layer on top of the cladding layer;
    e) and arranging a first metal contact (9, 80) on top of the contact layer, above said first set of layers;

f) etching the contact layer and the cladding layer, using a second mask covering the first waveguide mesa in the unmasked areas; and g) applying insulating material in the areas not covered with the second mask during etching in step f), the insulating material having a dielectric constant that is less than a dielectric constant of the cladding layer.

2. The method according to claim 1, wherein the method further comprises the additional steps prior to step c):

b1) epitaxially growing a thin layer having a dopant of the second type on and around the first waveguide mesa, b2) and epitaxially growing an etch stop layer on top of the thin layer grown in step b1), whereby the etching in step f) is stopped by the etch stop layer grown in step b2).

3. The method according to any of claims 1-2, wherein said semiconductor material is an epitaxially grown layer on top of a substrate.

4. The method according to claim 3, wherein said substrate is a semi-insulating substrate, or a semiconductor substrate having a dopant of the first or the second type.

5. The method according to any of claims 1-4, wherein said semiconductor material is a semiconductor substrate.

6. The method according to any of claims 1-5, wherein said first photonic device is selected to be any of the group: laser, detector and amplifier.

7. The method according to any of claims 1-6, wherein said first mask is dimensioned to define the width of said first waveguide mesa to achieve single mode operation of said first photonic device.

8. The method according to any of claims 1-7, wherein the following steps are performed prior to step e):

applying the second mask on the contact layer, performing step f), removing said second mask, and performing step g).

9. The method according to claim 8, wherein the second mask is a metal mask, preferably made from Titanium.

10. The method according to any or claims 1-7, wherein said first metal contact arranged on top of the contact layer in step e) is used as the second mask in step f).

11. The method according to any of claims 8-9, wherein at least a second photonic device is optically connected with the first photonic device, the method comprising the additional steps prior to step b):

a1) applying an island mask on top of the first set of layers and removing the first set of layers in the unmasked areas, a2) epitaxially growing a second set of layers for the second photonic device, including at least a second waveguide layer, on the semiconductor material in the unmasked areas, and thereafter removing the island mask, thereafter modifying step b) so that said first mask also include to cover at least a part of said second set of grown layers, thus also forming a second photonic device region coupled to said first photonic device in a light transmission direction, and modifying step c) to include growing said cladding layer on top of said second set of layers in addition to said first set of layers, modifying step e) to include arranging a second metal contact on top of the contact layer, above said second set of layers, said first and second metal contacts being separated, modifying step f) to include using a second mask covering at least a part of said second set of layers in addition to covering the first waveguide mesa, and modifying step g) to include applying insulating material in the areas not covered with the second mask.

12. The method according to claim 11, wherein the method further comprises the additional steps prior to step c):

b3) epitaxially growing a thin layer having a dopant of the second type on and around the second photonic device region, b4) and epitaxially growing an etch stop layer on top of the thin layer grown in step b3), whereby the etching in step f) is stopped by the etch stop layer grown in step b4).

13. The method according to any of claims 11-12, wherein said second photonic device is selected to be a modulator.

14. The method according to any of claims 1-13, wherein the method further comprises the step of providing a window section adjacent to the first or the second photonic device in a light transmission direction thereof, where said second mask applied in step f) further include a window masking part.

15. The method according to claim 14, wherein said window masking part is selected to have a tapered shape.

16. The method according to any of claims 1-15, wherein said insulating material is selected to be a material which is easily planarised, preferably polymer.

17. A photonic device including at least a first photonic device comprising:

a first set of epitaxially grown layers, including at least a first waveguide layer, arranged in a first waveguide mesa on top of a semiconductor material having a dopant of a first type, a cladding layer having a dopant of a second type, opposite to said first type, arranged on top of said first set of layers and the surrounding semiconductor material a contact layer arranged on top of the cladding layer and a metal contact, for each photonic device, arranged on top of the contact layer said cladding and contact layer are shaped in an etching process to have a first contact mesa structure at least around the first waveguide mesa an insulating material applied around the first contact mesa structure, said insulating material having a thickness corresponding to approximately the combined thickness of the cladding and the contact layer.

18. The device according to claim 17, wherein a thin layer having a dopant of the second type is arranged on and around the first waveguide mesa, and an etch stop layer is arranged on top of the thin layer, whereby the etching of the cladding and contact layer, to shape the first contact mesa structure, is stopped by the etch stop layer.

19. The device according to claim 17 or 18, wherein said device further comprises at least a second photonic device, optically connected to said first photonic device, said second photonic device comprising:

a second set of epitaxially grown layers, including at least a second waveguide layer, formed in a second photonic device region being, coupled to said first photonic device in a light transmission direction, on top of the semiconductor material, and said cladding and contact layer are arranged on top of each second photonic device region.

20. The device according to claim 19, wherein said cladding and contact layer also are shaped to have a second contact mesa structure above a part of said second photonic device region, said first and second contact mesa structure being adjacent to each other.

21. The device according to claim 20, wherein a thin layer having a dopant of the second type is arranged on said second photonic device region (62), and an etch stop layer is arranged on top of the thin layer, whereby the etching of the cladding and contact layer, to shape the second contact mesa structure, are stopped by the etch stop layer.

22. The device according to any of claims 17-21, wherein said first photonic device is any of the group: laser, detector and amplifier.

23. The device according to any of claims 19-22, wherein said second photonic device is a modulator.

24. The device according to any of claims 19-22, wherein said device is provided with a window section arranged adjacent to said first or second photonic device in a light transmission direction thereof, said window section is preferably tapered.

25. The device according to any of claims 17-24, wherein said semiconductor material is an epitaxially grown layer on top of a substrate.

26. The device according to claim 25, wherein said substrate is a semi-insulating substrate, or a semiconductor substrate having a dopant of the first or the second type.

27. The device according to any of claims 17-24, wherein said semiconductor material is a semiconductor substrate.

28. The device according to any of claims 17-27, wherein said insulating material is a material which is easily planarised, preferably polymer.

* * * * *

UNITED STATES PATENT AND TRADEMARK OFFICE
CERTIFICATE OF CORRECTION

PATENT NO. : 7,273,565 B2
APPLICATION NO. : 10/506563
DATED : September 25, 2007
INVENTOR(S) : Stoltz et al.

It is certified that error appears in the above-identified patent and that said Letters Patent is hereby corrected as shown below:

Title Page
Item 57, Abstract, Line 12, change "or" to --of--
Item 57, Abstract, Line 16, after "manufacturing" omit ","

Column 2
Line 17, omit "that"

Column 4
Line 6, omit ","
Line 19, change "depend" to --depends--
Line 20, after "layer" insert --,--

Column 5
Line 39, omit "and"

Column 7
Line 56, change "include" to --includes--

Column 8
Line 22, change "include" to --includes--
Line 42, after the first instance of "layer" insert --,--
Line 61, omit ","
Line 62, omit ","

Signed and Sealed this

Eleventh Day of May, 2010

David J. Kappos
*Director of the United States Patent and Trademark Office*